United States Patent [19]

Okada et al.

[11] Patent Number: 4,866,443
[45] Date of Patent: Sep. 12, 1989

[54] A/D CONVERTER HAVING MULTIPLICATION FUNCTION

[75] Inventors: Keisuke Okada; Sumitaka Takeuchi, both of Itami, Japan

[73] Assignee: Mitsubishi Denki Kabushiki Kaisha, Tokyo, Japan

[21] Appl. No.: 111,047

[22] Filed: Oct. 21, 1987

[30] Foreign Application Priority Data

Oct. 31, 1986 [JP] Japan .................................. 61-261614

[51] Int. Cl.$^4$ ............................................... H03M 1/36
[52] U.S. Cl. ..................................... 341/159; 341/161; 341/165
[58] Field of Search ................ 341/155, 158, 159, 160, 341/161, 165

[56] References Cited
PUBLICATIONS

Verster, "IEEE Transactions on Electronic Computers" Aug. 1964, pp. 471–473.

Primary Examiner—William M. Shoop, Jr.
Assistant Examiner—Gary J. Romano
Attorney, Agent, or Firm—Nixon & Vanderhye

[57] ABSTRACT

A semiconductor integrated circuit includes a plurality of comparators for comparing an analog input with reference voltage or voltages, holding means for holding a digital value, and control means for controlling the outputs of the plurality of comparators by a control signal responsive to the digital value to output the multiplication result of the output values of the plurality of comparators and the digital value. Thus, the integrated circuit can construct a circuit having functions of an A/D converter and a multiplier on one chip.

8 Claims, 2 Drawing Sheets

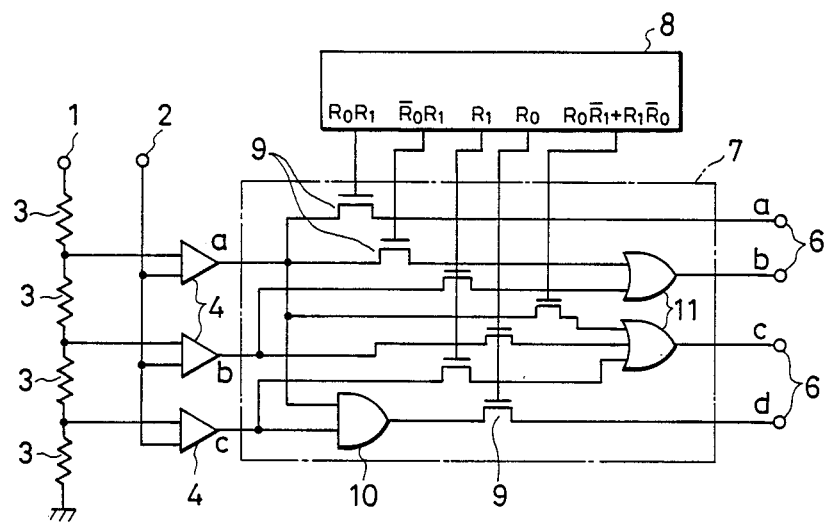

FIG. 3 PRIOR ART
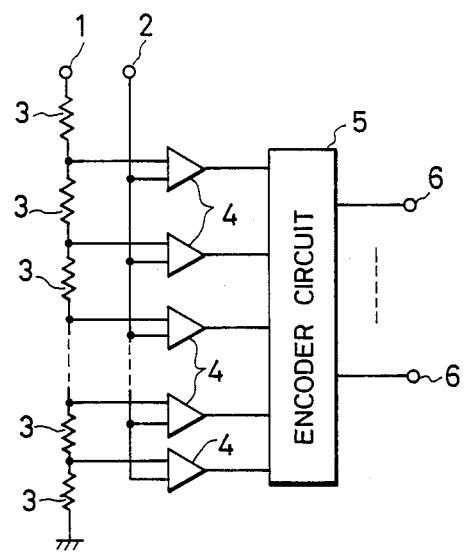
FIG. 4 PRIOR ART
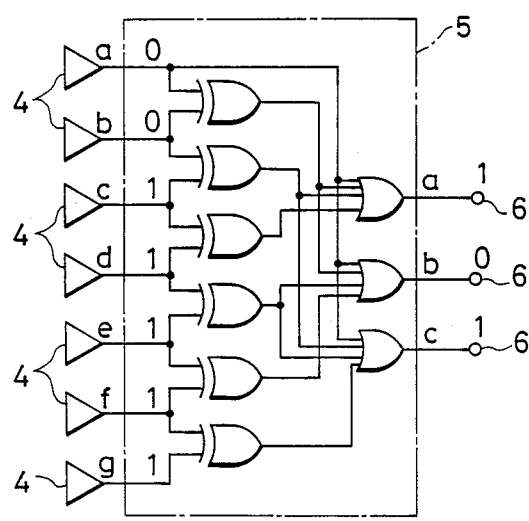
FIG. 5(a) PRIOR ART
| 4a | 4b | 4c | 4d | 4e | 4f | 4g |
|----|----|----|----|----|----|----|
| 0  | 0  | 1  | 1  | 1  | 1  | 1  |
COMPARATOR OUTPUT = 5
FIG. 5(b) PRIOR ART
| 6a | 6b | 6c |
|----|----|----|
| 1  | 0  | 1  |
ENCODE OUTPUT = 5

A/D CONVERTER HAVING MULTIPLICATION FUNCTION

BACKGROUND OF THE INVENTION

The present invention relates to a semiconductor integrated circuit and, particularly, to an A/D converter having a multiplying function in an encoder of a parallel comparison type A/D converter.

A digital signal process is intended for high performance, high integration and high function as a digital integrated circuit technique has been recently proceeded even in a field of a conventional signal process by an analog circuit. A/D converters are indispensable to digitally process an originally analog signal, such as a voice or an image.

FIG. 3 shows a conventional parallel comparison type A/D converter. Referring to FIG. 3, the A/D converter includes a reference voltage terminal 1, an analog input terminal 2, ladder resistors 3 connected in series between the reference voltage terminal 1 and a ground for determining the reference voltages of comparators 4, a plurality of comparators 4 aligned in parallel with each other, an encoder circuit 5, and digital output terminals 6 connected to the outputs of the encoder 5.

With such arrangement of the conventional A/D converter, a voltage applied to the reference voltage terminal 1 is divided by the plurality of ladder resistors 3 connected in series, and reference voltages thus divided from the voltage by the respective ladder resistors 3 are sequentially applied to first inputs of the plurality of comparators 4, respectively. The comparators 4 each compare the inputs of the reference voltages with the analog signal inputted to the analog input terminal 2 connected at their other inputs, and output the compared results. The outputs of the comparators 4 are coded by the encoder circuit 5, and digital data are outputted to the parallel output terminals 6 connected to the outputs of the encoder circuit 5. When the output includes N bits, $(2^N - 1)$ comparators are required.

The conventional A/D converter will be described in more detail by referring to FIGS. 4 and 5. FIG. 4 shows a parallel comparison type A/D converter providing a 3-bit straight binary coded output, and FIGS. 5(a) and 5(b) show examples of the outputs of the comparators and the outputs of the encoder circuit of the A/D converter. Since the A/D converter uses parallel comparison, the outputs of the comparators 4 are all "1" (=high) or "0" (=low), or continuous two values having one different output, one of which indicates the value of the analog input. In the A/D converter of FIG. 4, the values example shown in the outputs are different bit outputs 4b and 4c.

When the encoder 5 is constructed as shown in FIG. 4 in the conventional A/D converter with the comparators 4 connected to the inputs of the encoder 5 as shown in FIG. 5(a), the output of the encoder 5 (6a is the most significant bit) produces "5" as shown in FIG. 5(b) with respect to the comparison output "5".

Since the conventional A/D converter is constructed as described above, a multiplier of another chip is required to produce a product of the digital output of the A/D converter and other data. Further, when a high speed multiplier is constructed, there arise drawbacks that the chip area of the multiplier of another chip is increased, and a number of multipliers must be integrated on the same chip.

SUMMARY OF THE INVENTION

An object of the present invention is to provide a semiconductor integrated circuit which can eliminate the above-mentioned drawbacks and which can provide a circuit having functions of an A/D converter and a multiplier on one chip.

In order to achieve this and other objects, a semiconductor integrated circuit comprising a plurality of comparators for comparing an analog input with reference voltage or voltages, holding means for holding a digital value, and control means for controlling the outputs of the plurality of comparators with a control signal responsive to the digital value to output the multiplication result of the output values of the plurality of comparators and the digital value.

Since the the outputs of the plurality of comparators for processing the analog input are controlled by the control signal responsive to the digital value in the present invention to obtain the multiplied result of the outputs and the digital value, a multiplication type A/D converter can be constructed without a multiplier of another chip to highly integrate the A/D converter.

BRIEF DESCRIPTION OF THE DRAWINGS

FIG. 1 is a view showing a semiconductor integrated circuit of an embodiment of the present invention;

FIG. 2 is a view showing an example of data to be input and output in the integrated circuit;

FIG. 3 is a view showing a conventional parallel comparison type A/D converter;

FIG. 4 is a view for describing the operation of the A/D converter of FIG. 3; and FIGS. 5(a) and 5(b) are views showing an example of the outputs of the comparators and the outputs of the encoder of the conventional A/D converter.

DETAILED DESCRIPTION OF THE PREFERRED EMBODIMENTS

In FIG. 1, reference numerals 1 to 4 and 6 depict the same components as those of the conventional A/D converter shown in FIG. 3, respectively, and therefore descriptions of these components are omitted for avoidance of duplication. Reference numeral 7 depicts a controller for controlling the outputs of comparators 4 in response to a control signal responsive to an inputted digital value to output the multiplied result of the A/D converted value of the analog input and the digital value. Reference numeral 9 depicts a transfer gate for controlling the transmission of the outputs of the comparators 4. Reference numeral 10 depicts an AND gate, reference numeral 11, OR gates, and reference numeral 8, a control signal generator for producing the control signal in response to the value of the digital input.

With such construction of the A/D converter, the operation to the outputs of the comparators 4 is the same as that of the conventional A/D converter. Then, as shown in FIG. 2, assume that the outputs of the comparators 4 are $4a$=low, $4b$=$4c$=high, and 2-bit digital inputs are R0=R1=high. In this state, the outputs (analog inputs) of the comparators 4 indicate "2", and the digital input indicates "3". When these digital inputs (R0, R1) are applied to the controller, the control signal generator 8 generates 5 types of control signals of $.R0.R1$, $\overline{R0}.R1$, $R0.\overline{R1}+\overline{R0}.R1$, $R0$, and $R1$. These control signals are applied as gate signals to the gates of the transfer gates 9 in the controller 7. As a result, the controller 7 outputs a signal indicating "6" to the encode output terminal 6 in the example of FIG. 2.

As described above, when the controller 7 is constructed as above, this A/D converter outputs the multiplied result of the A/D converted value of the analog input and the digital input to the output terminal 6. Since the outputs of the comparators are directly signal processed to obtain a product of the analog input and the digital value in this embodiment, another multiplier is not required to accelerate the operation, to highly integrate the A/D converter and to enhance the function.

In the embodiment described above, the parallel comparison type is employed. However, the present invention is not limited to the particular embodiment. For example, a series/parallel comparison type may be also employed in the invention, and the same advantages as those in this embodiment are obtained.

According to the semiconductor integrated circuit of the present invention as described above, the outputs of the comparators are directly signal processed to output a product of the analog input and the digital input. Therefore, the provided semiconductor integrated circuit is accelerated in its operation and is highly integrated with high function.

What is claimed is:

1. A semiconductor integrated circuit comprising a plurality of comparators for comparing an analog input with reference voltage or voltages and for providing multi-bit digital output values, holding means for holding a multi-bit digital value, and control means for controlling the outputs of the plurality of comparators by a control signal responsive to the digital value to output the arithmetic multiplication product of the multi-bit output values of the plurality of comparators and the multi-bit digital value.

2. An A/D converter having a multiplication function comprising:
   a plurality of comparators each for comparing an analog input with a reference value and for producing multi-bit results of said comparisons at respective outputs thereof,
   holding means for holding a multi-bit digital value, and
   control means connected to said comparator outputs and to said holding means for producing a control signal corresponding to said digital value held by said holding means and for producing an arithmetic product of said multi-bit outputs of said plurality of comparators and said multi-bit digital value.

3. The A/D converter as claimed in claim 2, wherein:
   said control means comprises a plurality of transfer gates having inputs connected to said outputs of said plurality of comparators and control inputs for receiving said control signal,
   a plurality of OR gates each having inputs connected to said outputs of at least two of said plurality of comparators, and
   an AND gate having inputs connected to said outputs of a different two of said plurality of comparators.

4. A multiplying analog-to-digital converter comprising:
   reference signal generating means for providing plural reference signals;
   plural signal comparing means each having first and second input terminals and an output terminal, said comparing means first input terminals connected in common to an analog input signal, said plural comparing means second input terminals connected to said corresponding plural reference signals, said plural comparing means each for comparing said signals applied to said first and second input terminals thereof and for producing a binary valued signal at the output terminal thereof indicating the result of said comparison;
   gating network means connected to the output terminals of said plural comparing means for selectively passing and not passing said binary valued signals produced by said comparing means to at least one converter output terminal in response to control signals received thereby; and
   control signal generating means connected to receive a inputted digital signal and providing said control signals to said gating means, for controlling said gating network means to provide the product of the combined output signals provided by said plural comparator means and said inputted digital signal.

5. A multiplying converter as in claim 4 wherein said control signal generating means receives a two-bit inputted digital signal $R_0R_1$ and comprises means for providing the following discrete output signals to said gating network means:
   (a) $R_0$,
   (b) $R_1$,
   (c) $R_0.R_1$,
   (d) $\overline{R_0}.R_1$, and
   (e) $R_0.\overline{R_1}+\overline{R_0}.R_1$.

6. A multiplying converter as in claim 5 wherein:
   said plural signal comparing means includes first, second and third of said comparator means and said converter has first through fourth output terminals (a)–(d); and
   said gating network means comprises:
   a first OR gate having first and second inputs, and having a output connected to said second output terminal (b),
   a second OR gate having first, second and third inputs, and having an output connected to said third output terminal (c),
   an AND gate having first and second inputs and having an output,
   a first gate transfer means connected between the output terminal of said first comparator means and said converter first output terminal (a) for selectively passing and not passing said first comparator means output signal to said converter first output terminal (a) in response to said control signal $R_0.R_1$,
   a second gate transfer means connected between said first comparator means output terminal and said first OR gate first input for selectively passing and not passing said first comparator means output signal to said first OR gate first input in response to said control signal $\overline{R_0}.R_1$,
   a third gate transfer means connected between said second comparator means output terminal and said first OR gate second input for selectively passing and not passing said second comparator means output signal to said first OR gate second input in response to said control signal $R_1$,
   a fourth gate transfer means connected between said second comparator means output terminal and said second OR gate first input for selectively passing and not passing said second comparator means output signal to said second OR gate first input in response to said control signal $R_0$, a fifth gate transfer means connected between said first comparator means output terminal and said second OR gate second input for selectively passing and not passing said first comparator means output signal to said second OR gate second input in response to said control signal $R_0 \cdot \overline{R}_1 + \overline{R}_0 \cdot R_1$, a sixth gate transfer means connected between said third comparator means output terminal and said second OR gate third input for selectively passing and not passing said third comparator means output signal to said second OR gate third input in response to said control signal $R_1$, said AND gate first input being connected to said first comparator means output terminal, said AND gate second input being connected to said third comparator means output terminal, and a seventh gate transfer means connected between said AND gate output and said fourth converter output terminal (d) for selectively passing and not passing said AND gate output signal to said converter fourth output terminal in response to said control signal $R_0$.

7. A multiplying converter as in claim 4 wherein said gating network means selectively directly connects at least one of said plural comparator means output terminals to said converter output terminal.

8. A multiplying converter as in claim 4 wherein said control signal generating means includes means for producing several different combinations of inverted and non-inverted combinations of said inputted digital signals.

* * * * *